US006713822B2

(12) United States Patent
Shimoji

(10) Patent No.: US 6,713,822 B2
(45) Date of Patent: Mar. 30, 2004

(54) SEMICONDUCTOR DEVICE

(75) Inventor: Noriyuki Shimoji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/853,971

(22) Filed: May 11, 2001

(65) Prior Publication Data

US 2001/0020721 A1 Sep. 13, 2001

Related U.S. Application Data

(62) Division of application No. 09/237,730, filed on Jan. 26, 1999, now abandoned.

(30) Foreign Application Priority Data

Jan. 27, 1998 (JP) ............................................. 10-14352

(51) Int. Cl.[7] ........................ H01L 29/76; H01L 31/062
(52) U.S. Cl. ........................ 257/401; 257/249; 257/395; 257/500; 257/647
(58) Field of Search ........................ 257/249, 394–397, 257/401, 500, 509, 647

(56) References Cited

U.S. PATENT DOCUMENTS

| 4,543,592 A | 9/1985 | Itsumi et al. ................. 257/369 |
| 5,200,637 A | * 4/1993 | Matsuo et al. ............... 257/368 |
| 5,610,101 A | 3/1997 | Koyama |
| 5,811,862 A | 9/1998 | Okugaki et al. ............. 257/390 |
| 6,097,066 A | * 8/2000 | Lee et al. .................... 257/355 |

FOREIGN PATENT DOCUMENTS

| JP | 07-74353 A | * 5/1995 | ............ H01L/29/78 |
| JP | 9-307091 A | * 11/1997 | ......... H01L/27/146 |

* cited by examiner

Primary Examiner—Allan R. Wilson
Assistant Examiner—Matthew E. Warren
(74) Attorney, Agent, or Firm—Merchant & Gould P.C.

(57) ABSTRACT

Provides a semiconductor device that can separate components easily. Gate electrode 42 is formed only within component forming region 32, and gate electrode 42 and aluminum wiring 48 are connected in component forming region 32. Therefore, there is almost no inversion of the surface of the semiconductor substrate 36 that is under field oxide film 38 due to the voltage of the concerned connection area and gate electrode 42. Also, there is interlayer film 44 between aluminum wiring 48 and field oxide film 38, so there is almost no inversion of the surface of the semiconductor substrate 36 that is under field oxide film 38 due to the voltage of aluminum wiring 48. Therefore, it is possible to separate components without increasing overall length L1 of field oxide film 38, increasing the film thickness of field oxide film 38, or increasing the concentration of channel stop ions implanted into the surface of the semiconductor substrate 36 that is under field oxide film 38.

8 Claims, 9 Drawing Sheets

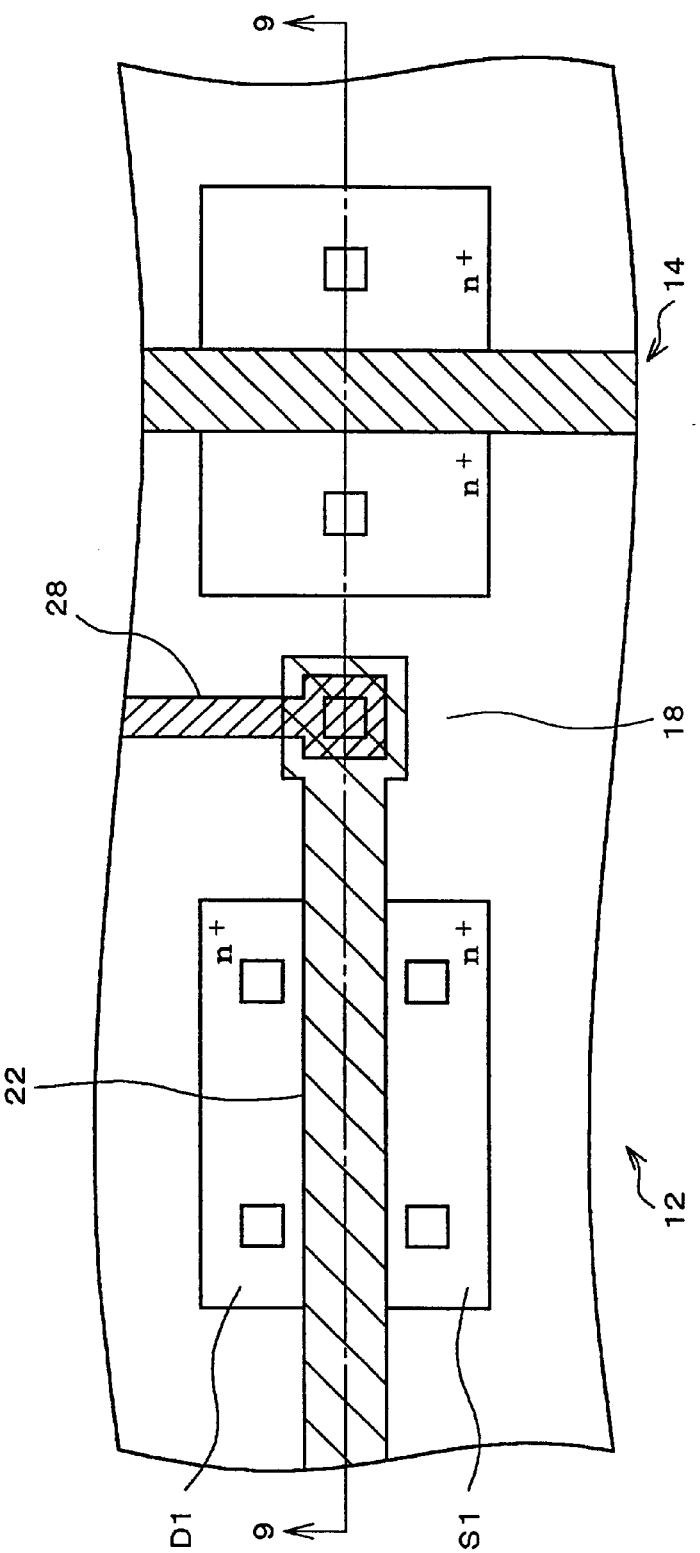
FIG.8 <PRIOR ART>

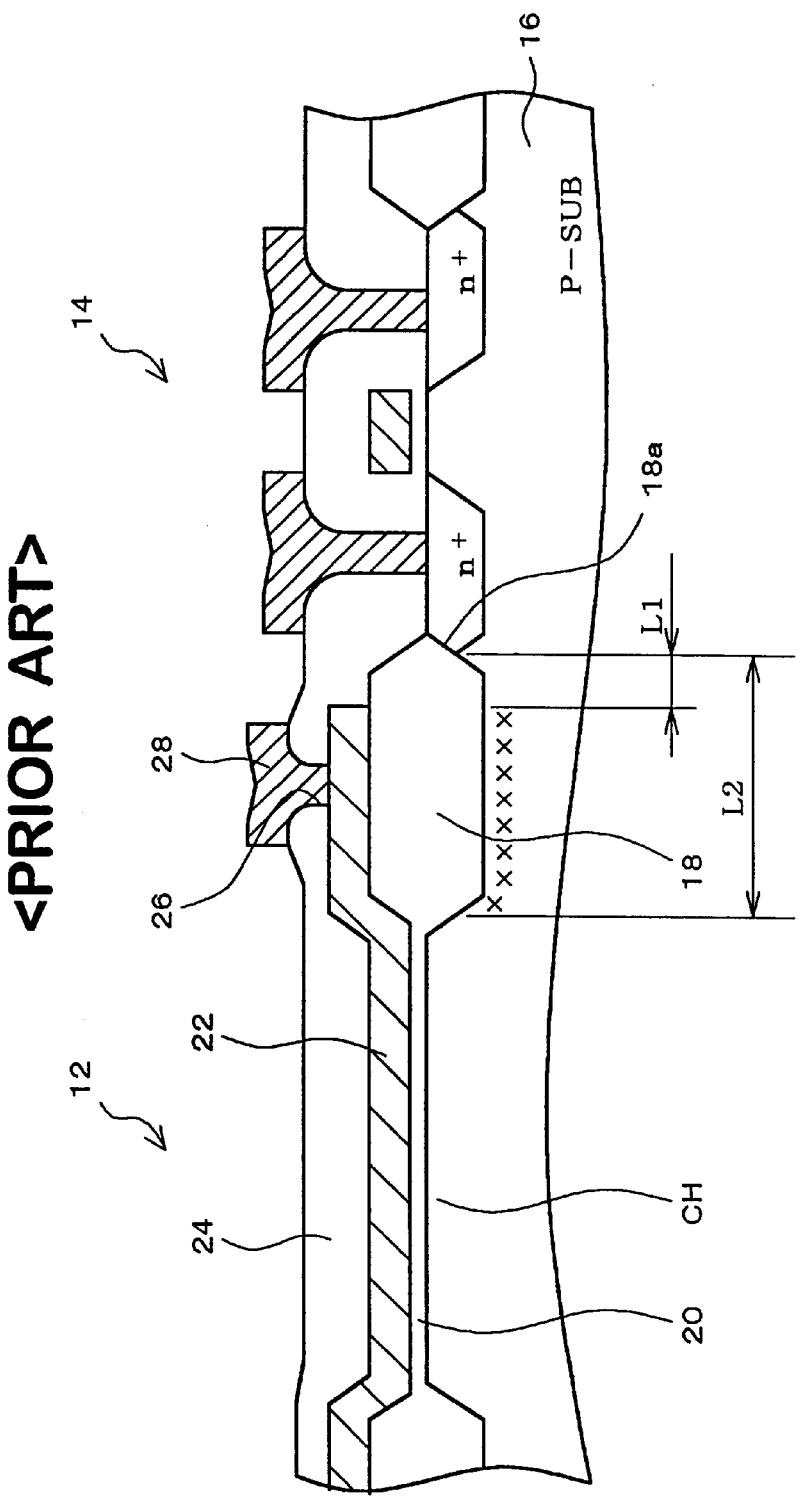
FIG.9 <PRIOR ART>

SEMICONDUCTOR DEVICE

This application is a divisional of application Ser. No. 09/237,730, filed Jan. 26, 1999 now ABANDONED, which application(s) are incorporated herein by reference.

CROSS-REFERENCE TO RELATED APPLICATION

The entire disclosure of Japanese Patent Application No. Hei 10-14352 filed on Jan. 27, 1998 including specification, claims, drawings and summary are incorporated herein by reference in its entirety.

BACKGROUND OF THE INVENTION

1. Field of the Invention

The present invention relates to a semiconductor device, and more particularly to a technique for improving the component separating function of a semiconductor device.

2. Description of the Related Art

MOS type field effect transistors (Metal Oxide Semiconductor Field Effect Transistor) are known as semiconductor components. FIG. 8 is a conceptual figure of a flat structure of a semiconductor device comprising conventional MOS type field effect transistors (referred to at times hereafter simply as "transistor"). FIG. 9 shows cross-section 9—9 of FIG. 8.

As shown in FIG. 9, a transistor 12 is formed within this semiconductor device. The transistor 12 comprises a channel forming region CH which is sandwiched between source S1 and drain D1 (see FIG. 8).

A gate electrode 22 is formed on the channel forming region CH via a gate oxide film 20. An interlayer film 24 is formed on the gate electrode 22. An aluminum wiring 28 is formed on the interlayer film 24. The gate electrode 22 and the aluminum wiring 28 are connected via a contact hole 26 which is formed in the interlayer film 24.

Another transistor 14 is formed on the semiconductor device separately from the transistor 12 via a field oxide film 18 for component separation. Thus, by interposing the field oxide film 18 between the two transistors 12 and 14, it is possible to separate the transistors electrically.

However, such conventional semiconductor devices have the following type of problems. As shown in FIG. 9, the contact hole 26 for connecting the gate electrode 22 and the aluminum wiring 28 is formed on the field oxide film 18. Therefore, part of the gate electrode 22 of the transistor 12 is placed directly on top of the field oxide film 18.

Thus, when a voltage is applied to the gate electrode 22, there is a possibility of the surface of semiconductor layer 16 (the part shown by the "x" mark in the figure) directly below the field oxide film 18 being inverted. There is a particularly high risk for this with high withstand voltage transistors for which a high voltage is applied to the gate electrode 22. If the surface of the semiconductor layer 16 beneath the field oxide film 18 is inverted, the inverted portion will not function as a component separating region.

To electrically separate the transistor 12 and the transistor 14 to avoid this situation, a sufficiently large length L1 of the non-inverted part can be secured. However, with this method, the overall length L2 of the field oxide film 18 becomes long, so the layout space for the transistor 12 and the transistor 14 becomes large. This leads to a reduction in the degree of integration of the semiconductor device.

Another method that can be considered to avoid the problem described above is making the film thickness of the field oxide film 18 thick. However, if the overall length L2 of the field oxide film 18 is left as is and the film thickness is increased, the incline angle of the area near the edge (bird's beak area) 18a of the field oxide film 18 becomes large, and the degree of concentration of the electrical field for the edge area 18a becomes larger. This makes it impossible to obtain the desired withstand voltage.

Also, if the film thickness of the field oxide film 18 is increased, a greater time is required for forming the field oxide film 18, so production efficiency is lowered, and production costs are increased.

As a further method for avoiding the problems described above, we can consider a method of increasing the density of channel stop ions implanted into the surface of the semiconductor layer 16 which is under the field oxide film 18. However, if the density of the channel stop ions is increased, there is a decrease in the withstand voltage.

SUMMARY OF THE INVENTION

An object of the present invention is to provide a semiconductor device that solves these types of problems and that can separate components easily.

In accordance with characteristics of the present invention, there is provided a semiconductor device comprising:
 a base semiconductor layer,
 an insulation film for separating components formed on the base semiconductor layer, and
 a semiconductor component which is formed on the base semiconductor layer in a component forming region separated by the insulation film for separating components, the semiconductor component having a first conductive layer,
 wherein the semiconductor device comprises:
 an interlayer insulation film placed on the insulation film for separating components and the first conductive layer, and
 a second conductive layer placed on the interlayer insulation film,
 wherein the first conductive layer is substantially formed only within the component forming region, and
 wherein the first conductive layer and the second conductive layer are substantially connected only within the component forming region.

In accordance with characteristics of the present invention, there is provided a wiring method for a semiconductor device comprising an insulation film for separating components formed on a base semiconductor layer, wherein wiring is substantially performed using a first wiring layer only within a component forming region separated by the insulation film for separating components;
 wiring is performed using a second wiring layer on an interlayer insulation film formed on the insulation film for separating components and the first wiring layer;
 the first wiring layer and the second wiring layer are substantially connected only within the component forming region.

The characteristics of the present invention are broadly indicated as noted above, but the structure, contents, object, and features will be clearer through reference to the figures and according to the following disclosure.

BRIEF DESCRIPTION OF THE DRAWINGS

FIG. 8 conceptually illustrates a flat structure of a semiconductor device comprising a conventional MOS type field effect transistor; and FIG. 9 is a cross-sectional view taken along line 9—9 of FIG. 8.

DESCRIPTION OF THE EMBODIMENTS

Figure 1:
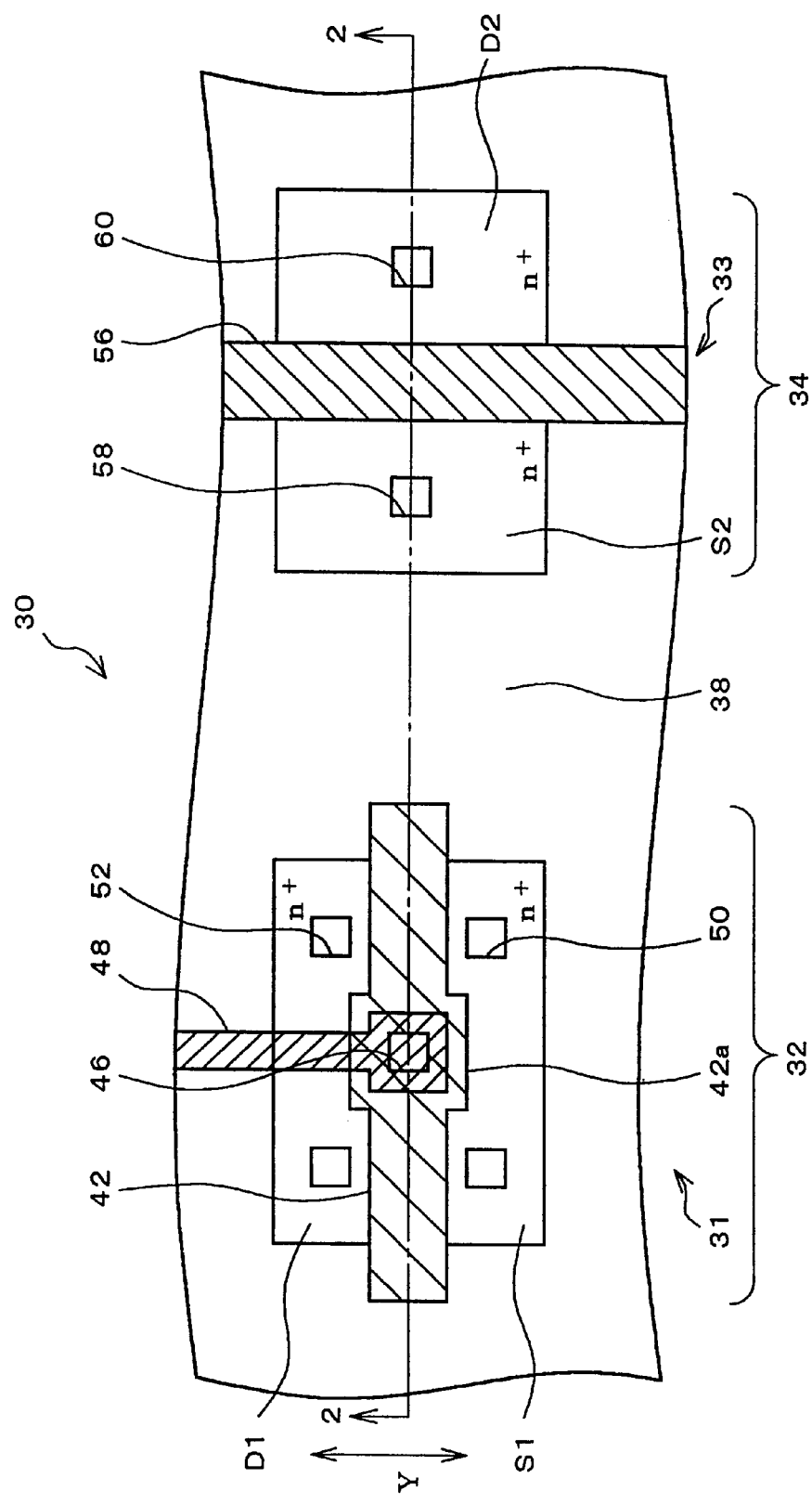
FIG. 1 conceptually illustrates a flat structure of a semiconductor 30 which is a semiconductor device according to an embodiment of the present invention and comprising a transistor 31.
Figure 2:
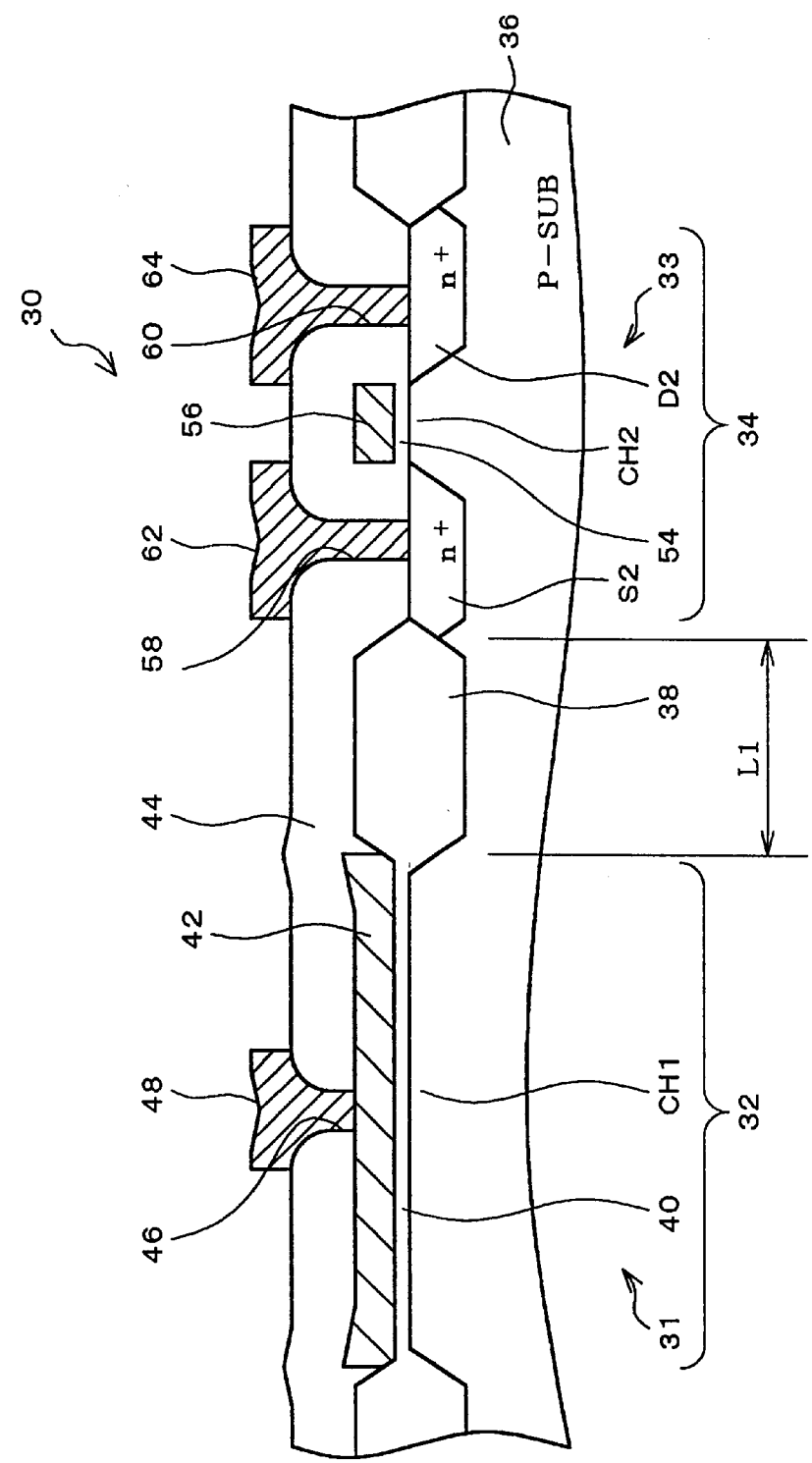
FIG. 2 is a cross-sectional view taken along line 2—2 of FIG. 1.

FIG. 1 conceptually illustrates a flat structure of a semiconductor device 30 which is a semiconductor device according to an embodiment of the present invention and which comprises a transistor 31 (semiconductor component). FIG. 2 is a cross-sectional view taken along line 2—2 of FIG. 1.

As shown in FIG. 1, the semiconductor device 30 comprises the transistor 31 and a transistor 33. The transistor 31 is an N channel MOS type field effect transistor which controls the current flowing between source S1 and drain D1 according to the voltage applied to a gate electrode 42 which will be described later. The transistor 33 is also a MOS type field effect transistor. In this embodiment, both transistors are low withstand voltage transistors.

As shown in FIG. 2, the transistor 31 is formed in a component forming region 32, and the transistor 33 is formed in another component forming region 34. The component forming region 32 and the component forming region 34 are separated by a field oxide film for separating components 38 (insulation film for component separation) which is formed on a P type (second conductive type) semiconductor substrate 36 (base semiconductor layer). The field oxide film 38 can be formed, for example, using the LOCOS (Local Oxidation of Silicon) method.

The transistor 31 formed on the component forming region 32 comprises N type (first conductive type) source S1 (second semiconductor region) and N type drain D1 (first semiconductor region) both formed within the semiconductor substrate 36 with a specified distance interposed between (see FIG. 1). In the semiconductor substrate 36, the region sandwiched between source S1 and drain D1 is a channel forming region CH1.

A gate electrode 42 (first conductive layer, first wiring layer) is formed on the channel forming region CH1 via gate oxide film 40 (gate insulation film). The gate electrode 42 is composed from polysilicon. An interlayer film 44 (interlayer insulation film) is formed on the gate electrode 42 and the field oxide film 38. A gate-use aluminum wiring 48 (second conductive layer, second wiring layer) is formed on the interlayer film 44.

The gate electrode 42 and the aluminum wiring 48 are connected via contact hole 46 formed in the interlayer film 44.

A source aluminum wiring (not illustrated) and a drain aluminum wiring (not illustrated) of the transistor 31 are formed on the interlayer film 44. The source aluminum wiring is connected to source S1 via contact hole 50 (see FIG. 1) which rs formed in the interlayer film 44. Similarly, the drain aluminum wiring is connected to drain D1 via contact hole 52 (see FIG. 1) formed in the interlayer film 44.

In contrast, as shown in FIG. 2, the transistor 33 formed in the component forming region 34 comprises N type source S2 and drain D2 formed within the semiconductor substrate 36 with a specified distance between them. In the semiconductor substrate 36, the region sandwiched between source S2 and drain D2 is a channel forming region CH2.

A gate electrode 56 is formed on the channel forming region CH2 via gate oxide film 54. As with the transistor 31, the interlayer film 44 covers the top of the gate electrode 56.

A source aluminum wiring 62 and a drain aluminum wiring 64 of the transistor 33 are formed on the interlayer film 44. The source aluminum wiring 62 is connected to source S2 via contact hole 58 formed in the interlayer film 44. Similarly, the drain aluminum wiring 64 is connected to drain D2 via contact hole 60 formed in the interlayer film 44.

As shown in FIG. 2, this embodiment is structured such that the gate electrode 42 is formed only within the component forming region 32. Therefore, the gate electrode 42 is not substantially formed on the field oxide film 38. Because of this, there is very low risk of inversion of the surface of the semiconductor substrate 36 which is under the field oxide film 38 due to the voltage of the gate electrode 42.

The invention is constructed so that the gate electrode 42 and the aluminum wiring 48 are connected within the component forming region 32. Therefore, there is a low possibility of inversion of the surface of the semiconductor substrate 36 which is under the field oxide film 38 due to the voltage of the concerned connection part.

Furthermore, part of the aluminum wiring 48 is formed on the field oxide film 38 (see FIG. 1), but because the interlayer film 44 is between the aluminum wiring 48 and the field oxide film 38, there is little risk of inversion of the surface of the semiconductor substrate 36 under the field oxide film 38 due to the voltage of the aluminum wiring 48.

Thus, it is possible to separate components without increasing overall length L1 of the field oxide film 38. Therefore, it is not necessary to expand the distance between the transistor 31 and the transistor 33. It is also possible to separate components without increasing the film thickness of the field oxide film 38 or increasing the concentration of channel stop ions implanted into the surface of the semiconductor substrate 36 which is under the field oxide film 38.

In other words, it is easy to separate components without making sacrifices in terms of items such as level of integration, withstand voltage, or manufacturing cost.

In this embodiment, the film thickness of the field oxide film 38 is approximately 5000 Å, the film thickness of the gate electrodes 42 and 56 is approximately 3000 Å, and the film thickness of the aluminum wiring 48, 62, and 64 is approximately 10000 Å.

The concentration of boron (B) which is the channel stop ion implanted into the surface of the semiconductor substrate 36 which is under the field oxide film 38 is $5 \times 10^{13}$ cm$^{-2}$, and the implantation energy is 30 KeV.

As shown in FIG. 1, with this embodiment, the device is structured such that the width in the channel length direction (Y direction in the figure) for an area 42a near the connection with the aluminum wiring 48 (i.e. near the contact hole 46) in the gate electrode 42 is wider than the width of other areas. This allows a margin to be secured when connecting the gate electrode 42 and the aluminum wiring 48 (i.e. the position matching margin of the contact hole 46).

Therefore, even with a low withstand voltage transistor with a relatively small channel length, it is possible to secure a contact between the gate electrode 42 and the aluminum wiring 48 without substantially changing the channel length.

Figure 3:
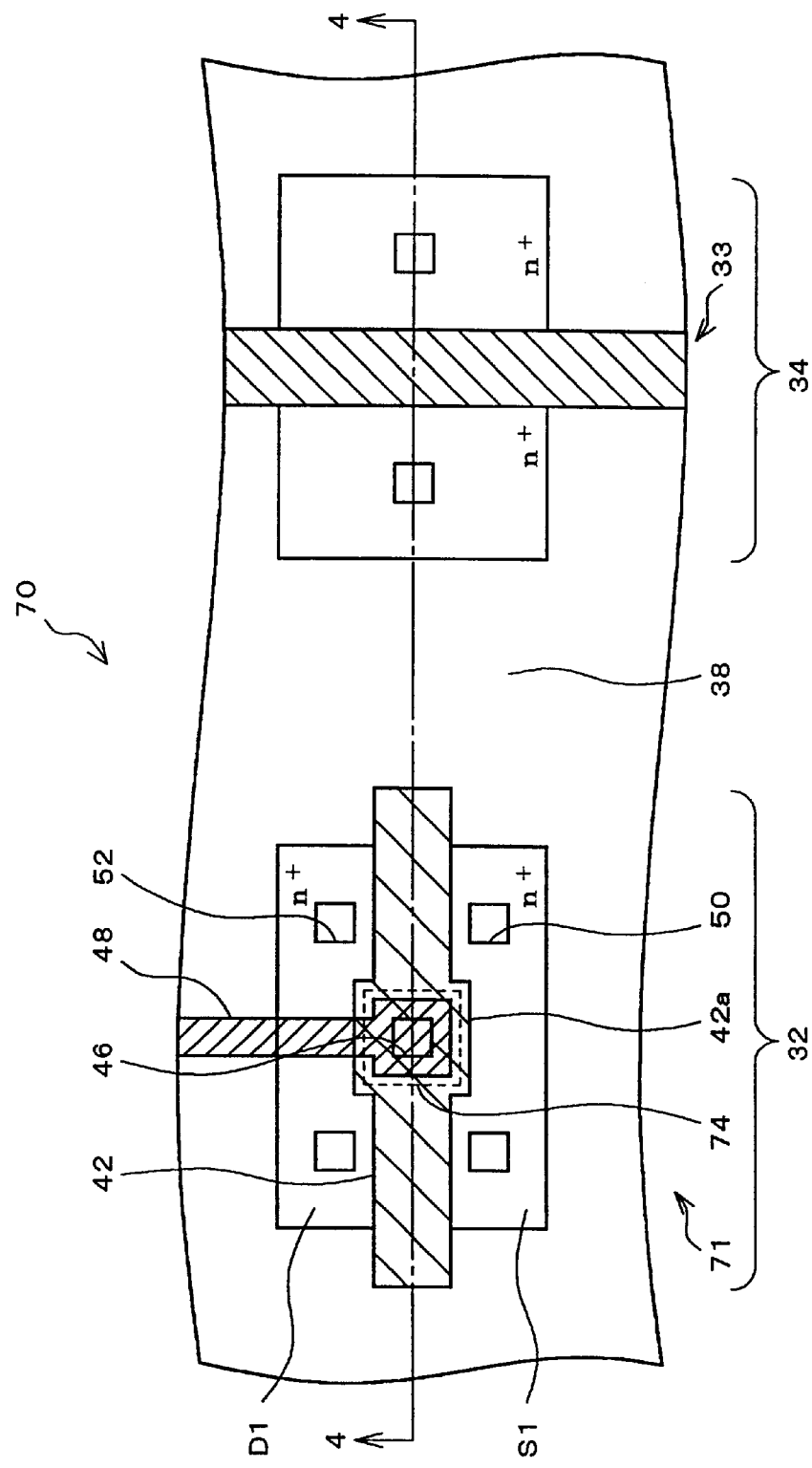
FIG. 3 conceptually illustrates a flat structure of a semiconductor device 70 which is a semiconductor device according to another embodiment of the present invention.
Figure 4:
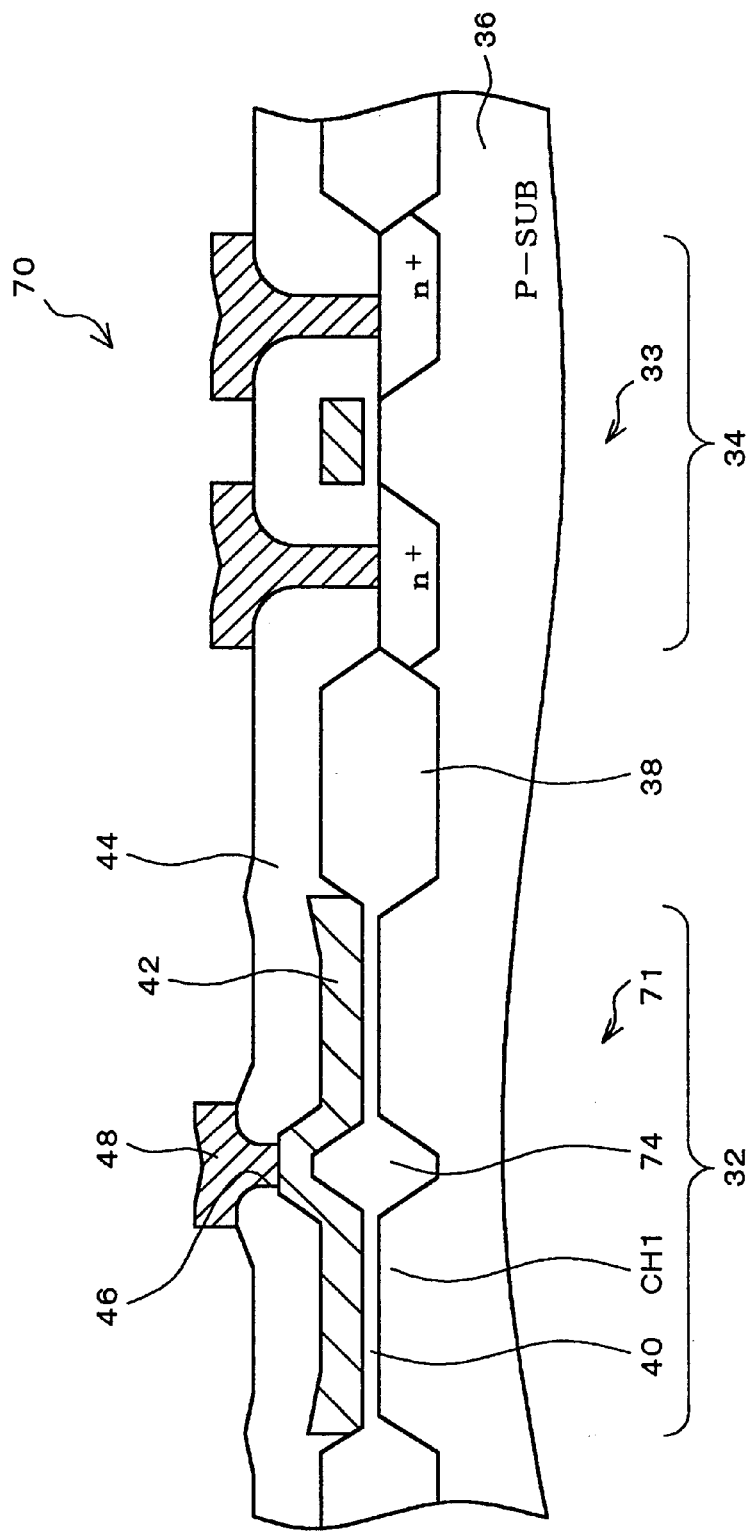
FIG. 4 is a cross-sectional view taken along line 4—4 of FIG. 3.

Next, FIG. 3 conceptually illustrates a flat structure of a semiconductor device 70 comprising a transistor 71 (semiconductor component) which is a semiconductor device according to another embodiment of the present invention. FIG. 4 is a cross-sectional view taken along line 4—4 of FIG. 3.

As shown in FIG. 4, this semiconductor device 70 has almost the same structure as the semiconductor device 30 described above, but comprises the transistor 71 instead of the transistor 31 (see FIG. 2). Similar to the transistor 31, the transistor 71 is a MOS type field effect transistor.

However, in contrast to the transistor 31, for the transistor 71, the film thickness of an oxide film 74 (an insulation film that continues the gate insulation film and that is beneath the connection area between the first semiconductor layer and the second semiconductor layer) near the connecting area of the gate electrode 42 and the aluminum wiring 48 (i.e. directly beneath the contact hole 46) is structured so as to be thicker than the film thickness of the gate oxide film 40 in areas other than the oxide film 74.

By using such a structure, it is possible to more securely prevent etching damage to the gate oxide film 40 and the channel forming region CH1 under this gate oxide film 40 when opening the contact hole 46 in the interlayer film 44 using, for example, the RIE (reactive ion etching) method.

The oxide film 74 with this thick film thickness can be formed using a method such a the LOCOS method described above for the same process as that used to form the field oxide film 38. By doing this, it is possible to form the oxide film 74 with a greater film thickness without increasing the number of processes.

Figure 5:
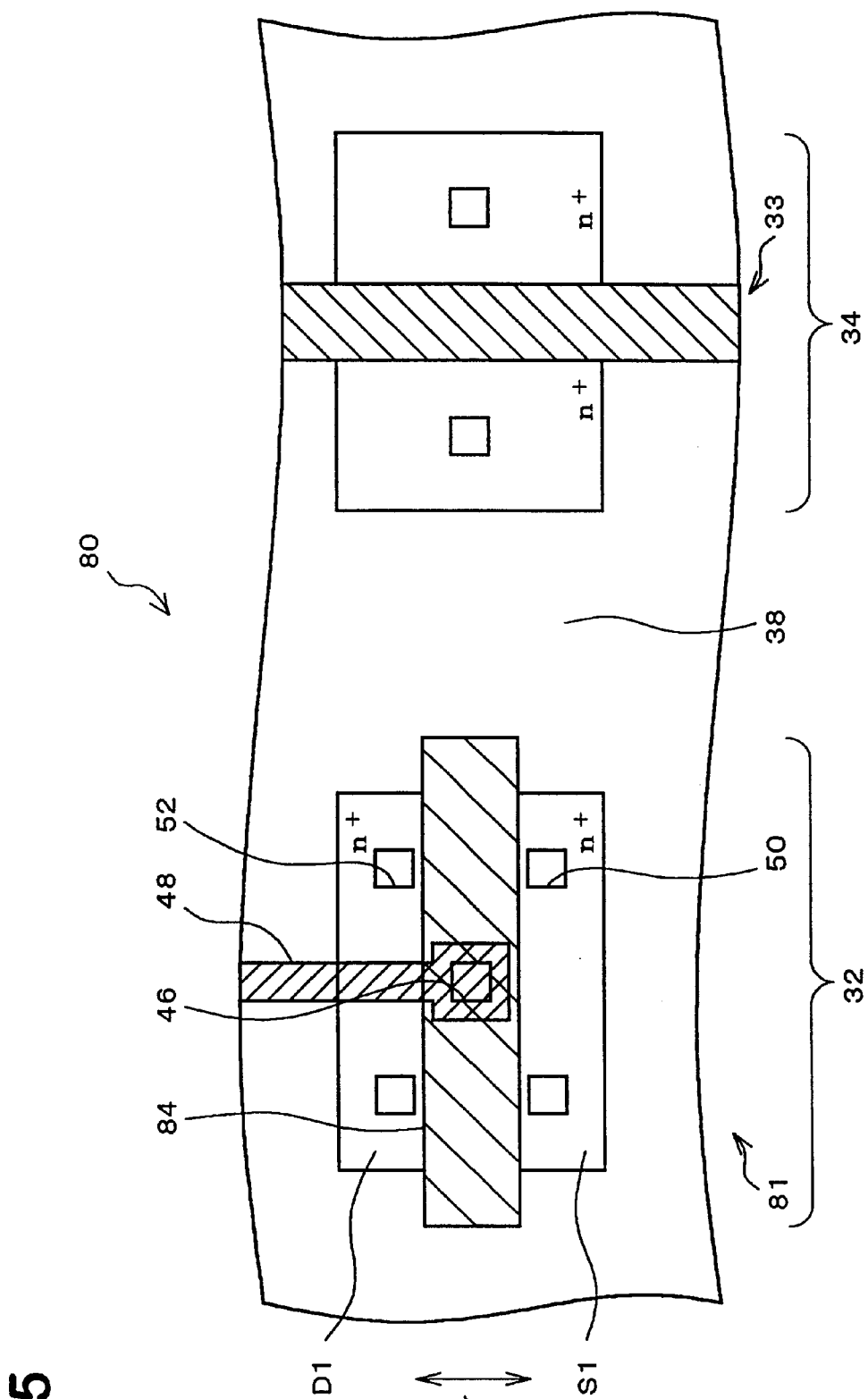
FIG. 5 conceptually illustrates a flat structure of a semiconductor device 80 which is a semiconductor device according to another embodiment of the present invention.

Next, FIG. 5 conceptually illustrates a flat structure of a semiconductor device 80 comprising a transistor 81 (semiconductor component), which is a semiconductor device made according to another embodiment of the present invention. The cross-sectional structure of the semiconductor device 80 is the same as that shown in FIG. 2, so is not noted here.

As shown in FIG. 5, this semiconductor device 80 has almost the same structure as that of the semiconductor device 30 described above, but comprises the transistor 81 which is a high withstand voltage type instead of the transistor 31 (see FIG. 1). In contrast to the transistor 31, for the transistor 81, the width in the channel length direction (Y direction in the figure) of the area near the connection area with the aluminum wiring 48 (i.e. near the contact hole 46) is the same as the width of other areas.

This is due to the following. Similar to the transistor 31, the transistor 81 is a MOS type field effect transistor, but in contrast to the transistor 31, it is a high withstand voltage type transistor. Therefore, for the transistor 81, the width in the channel length direction of a gate electrode 84 is broader than that of the transistor 31.

Thus, in contrast to the gate electrode 42 of the transistor 31, even if the width of the channel length direction in the area near the contact hole 46 is the same as the width of other parts, it is possible to secure a position matching margin for the contact hole 46.

In this way, when the width of the channel length direction of the gate electrode 84 is wide as it is with the high withstand voltage type transistor 81, it is possible to connect to the aluminum wiring 48 without changing the width of the channel length direction of the gate electrode 84, so there is no need to increase the planar projection area of the transistor 81. Therefore, it is possible to suppress the decrease in level of integration.

Also, for this semiconductor device 80, the high withstand voltage transistor 81 and the low withstand voltage transistor 33 are mixed, but the film thickness for the field oxide film 38 of the high withstand voltage transistor 81 and the film thickness of the field oxide film 38 of the low withstand voltage transistor 33 are both of the same thin film thickness.

This is because by using this invention, even with the field oxide film 38 of a thin film thickness such as that used with the low withstand voltage transistor 33, it is possible to separate components for the high withstand voltage transistor 81.

Therefore, there is no need to increase the field oxide film thickness for the low withstand voltage transistor 33 to match the thickness of the field oxide film of the high withstand voltage transistor 81, and it is also not necessary to change the film thickness of the field oxide film 38 between the high withstand voltage transistor 81 and the low withstand voltage transistor 33.

Specifically, even for a semiconductor device which mixes high withstand voltage transistors and low withstand voltage transistors as with E$^2$PROM and various drivers, it is possible to separate components easily without sacrificing items such as level of integration, withstand voltage, or manufacturing cost.

Even for the transistor 81, as with the transistor 71 (see FIG. 4) described above, it is possible to make the structure such that the film thickness of the oxide film (not illustrated, see the oxide film 74 in FIG. 4) near the connection area (i.e. immediately beneath the contact hole 46) of the gate electrode 42 and the aluminum wiring 48 is thicker than the film thickness of the gate oxide film of parts other than the concerned oxide film (not illustrated, see the gate oxide film 40 in FIG. 4).

Figure 6:
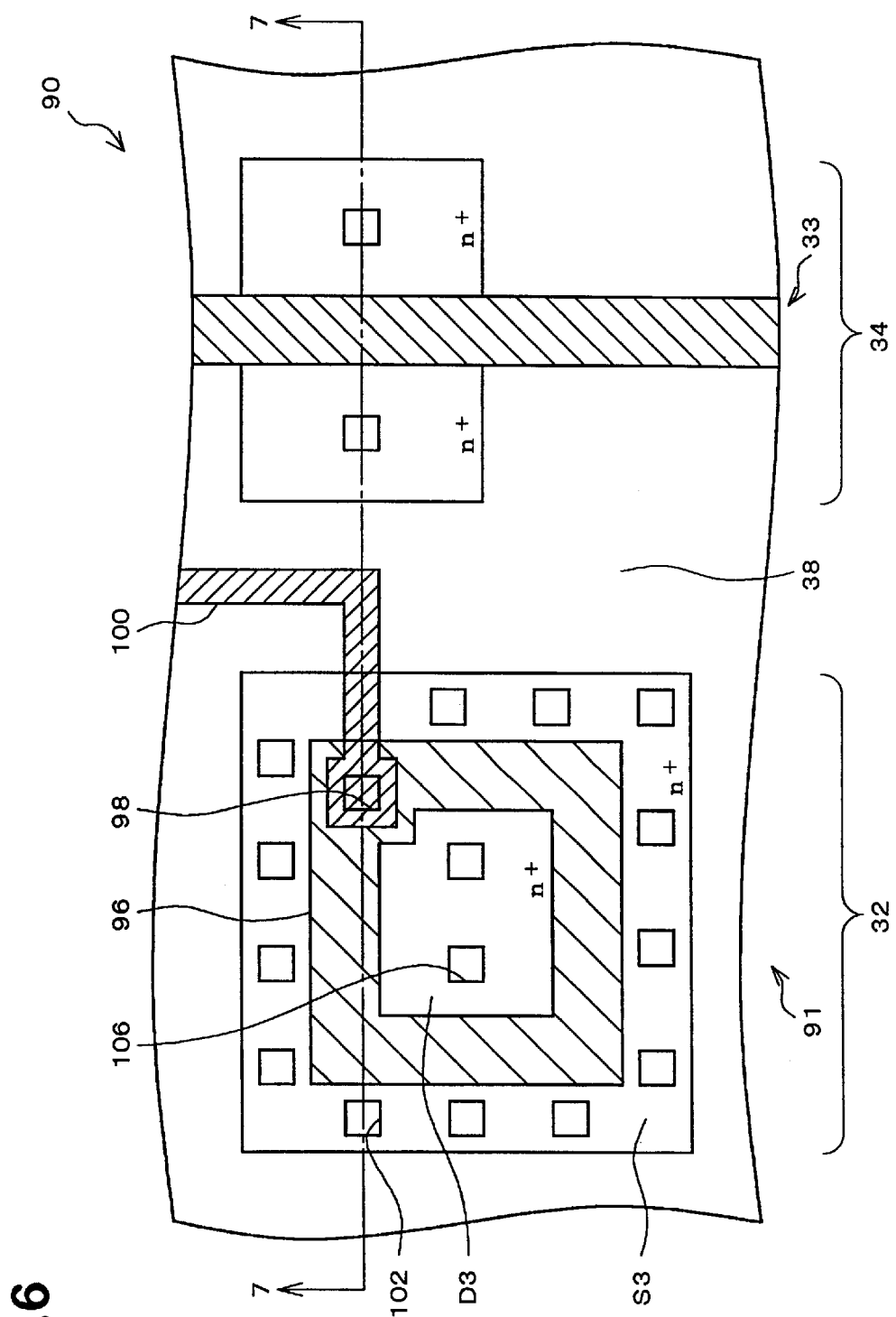
FIG. 6 conceptually illustrates a flat structure of a semiconductor device 90 which is a semiconductor device according to another embodiment of the present invention.
Figure 7:
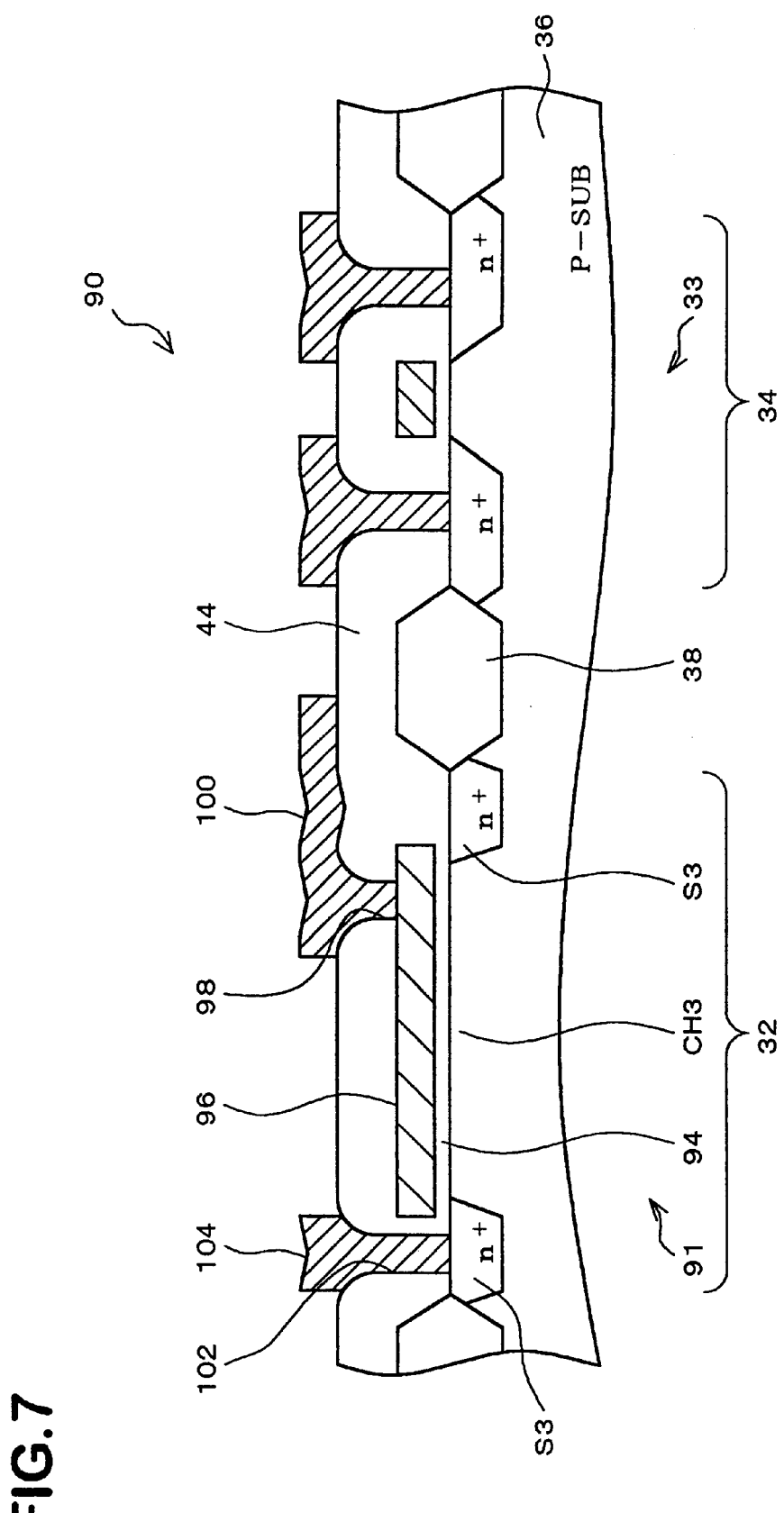
FIG. 7 is a cross-sectional view taken along line 7—7 of FIG. 6.

Next, FIG. 6 conceptually illustrates a flat structure of a semiconductor device 90 comprising a transistor 91 (semiconductor component), which is a semiconductor device according to yet another embodiment of the present invention. FIG. 7 shows a cross-sectional view taken along line 7—7 of FIG. 6.

As shown in FIG. 6, this semiconductor device 90 has approximately the same structure as that of the semiconductor device 80 described above, but comprises the transistor 91 instead of the transistor 81 (see FIG. 5). Similar to the transistor 31, the transistor 91 is a high withstand voltage MOS type field effect transistor.

However, in contrast to the transistor 81, the transistor 91 is structured such that the substantially flat shape of a channel forming region CH3, a gate oxide film 94, and a gate electrode 96 is made into a ring shape that circles drain D3, while the substantially flat shape of source S3 is made into a ring shape that circles the channel forming region CH3.

By using such a structure, drain D3 is isolated from the field oxide film 38. Thus, there is no occurrence of a decrease in the drain withstand voltage due to the effect of the channel stop ions implanted into the surface of the semiconductor substrate 36 which is below the field oxide film 38. In other words, it is possible to obtain a transistor with higher withstand voltage.

By using this invention, even with the transistor 91 which has a higher withstand voltage, specifically the transistor 91 for which a higher voltage is applied to the gate electrode 96, it is possible to separate components easily without sacrificing items such as level of integration, withstand voltage, and manufacturing cost.

As shown in FIG. 7, a source-use aluminum wiring 104 of the transistor 91 is formed on the interlayer film 44. The source-use aluminum wiring 104 is connected to source S3 via contact hole 102 which is formed in the interlayer film 44.

A drain-use aluminum wiring (not illustrated) of the transistor 91 is also formed in the interlayer film 44. The drain-use aluminum wiring is connected to drain D3 (see FIG. 6) via contact hole 106 which is formed in the interlayer film 44.

As shown in FIG. 6, the structure of the transistor 91 is such that the substantially flat shape of the channel forming region CH3, the gate oxide film 94, and the gate electrode 96 is made into a rectangular ring shape that circles drain D3, and the corner of the rectangular ring shaped gate electrode 96 is formed so that the gate electrode 96 and an aluminum wiring 100 are connected at the corner.

Therefore, by connecting the gate electrode 96 and the aluminum wiring 100 at the rectangular ring corner with a small current flowing between drain D3 and source S3, it is possible to connect the gate electrode 96 and the aluminum wiring 100 while minimizing the effect of the concerned current.

Even when the width required for connecting the gate electrode 96 and the aluminum wiring 100 is wider than the width of the gate electrode 96, by connecting the gate electrode 96 and the aluminum wiring 100 at the corner, it is possible to keep the increase in the area of the gate electrode 96 for the connecting area to a minimum. Therefore, it is possible to minimize the decrease in level of integration.

For the transistor 91 shown in FIG. 7 as well, as with the transistor 71 (see FIG. 4) described above, it is possible to have a structure so that the film thickness of the oxide film near the connecting area of the gate electrode 96 and the aluminum wiring 100 (i.e. directly beneath a contact hole 98) is thicker than the film thickness of the gate oxide film 94 that is in areas other than the concerned oxide film.

In the embodiments described above, we explained examples of using the present invention in semiconductor devices comprising only low withstand voltage transistors (semiconductor components) and semiconductor devices with a mixture of low withstand voltage transistors and high withstand voltage transistors, but the present invention can also be used for semiconductor devices comprising only high withstand voltage transistors.

Also, in the embodiments described above, we explained an example of a semiconductor device comprising an N channel MOS type field effect transistor, but the present invention is not limited thereto. For example, the present invention can also be used for semiconductor devices comprising P channel MOS type field effect transistors.

Also, for example, the present invention can be used for semiconductor devices comprising MOS type field effect transistors which have an LDD (lightly-doped drain), semiconductor devices comprising MOS type field effect transistors which have DD (double drain), and semiconductor devices comprising DMOS (double diffusion MOS type field effect transistors).

Further, for example, the present invention can be used for semiconductor devices comprising memory cells which have floating gates such as $E^2PROM$, semiconductor devices comprising bipolar type transistors, semiconductor devices comprising capacitors, and semiconductor devices comprising resistor components.

The present invention is such that a semiconductor device comprises an interlayer insulation film placed on an insulation film for separating components and on a first conductive layer, and a second conductive layer placed on the interlayer insulation film, and in that the first conductive layer is substantially formed only within a component forming region and that the first conductive layer and the second conductive layer are substantially connected only within the component forming region.

Therefore, the first conductive layer is substantially not formed on the insulation film for separating components, so there is little possibility of inversion of the surface of the base semiconductor layer which is under the insulation film for separating components due to the voltage of the first conductive layer.

Also, even when a second conductive layer is formed on an insulation film for separating components, there is an interlayer insulation film between the second conductive layer and the insulation film for separating components, so there is little possibility of inversion of the surface of the base semiconductor layer that is under the insulation film for separating components due to the voltage of the second conductive layer.

Furthermore, the first conductive layer and the second conductive layer are substantially connected only within the component forming region, so there is little possibility of inversion of the surface of the base semiconductor layer that is under the insulation film for separating components due to the voltage of the connection area.

Therefore, it is possible to separate components without increasing the overall length of the insulation film for separating components, increasing the film thickness of the insulation film for separating components, or increasing the concentration of impurities in the surface of the base semiconductor layer that is under the insulation film for separating components. In other words, it is possible to separate components easily without sacrificing items such as level of integration, withstand voltage, and manufacturing cost.

The present invention is such that the semiconductor components comprise a first conductive type first semiconductor region, a first conductive type second semiconductor region wherein the second semiconductor region is formed separated a specified distance from the first semiconductor region, a second conductive type channel forming region formed between the first semiconductor region and the second semiconductor region, a gate insulation film formed on the channel forming region, and a first conductive layer formed on the gate insulation film.

Therefore, even for a semiconductor device comprising a semiconductor component that controls the current flowing between a first semiconductor region and a second semiconductor region according to the voltage applied to a first conductive layer such as with a MOS type field effect transistor, for example, it is possible to separate components easily without sacrificing items such as level of integration, withstand voltage, and manufacturing cost.

The present invention is such that the substantially flat shape of the channel forming region, gate insulation film, and first conductive layer is a ring shape that circles a first semiconductor region, and the substantially flat shape of the second semiconductor region is a ring shape that circles the channel forming region.

Therefore, even for a semiconductor device comprising a semiconductor component for which a high voltage is applied to the first conductive layer such as with a high withstand voltage MOS type field effect transistor, for example, it is possible to separate components easily without sacrificing items such as level of integration, withstand voltage, and manufacturing cost.

The present invention is such that the substantially flat shape of the channel forming region, gate insulation film, and first conductive layer is a rectangular ring shape that circles a first semiconductor region, and in that the first conductive layer and second conductive layer are connected at the corner of the rectangular ring shaped first conductive layer.

Therefore, by connecting the first conductive layer and second conductive layer at the corner of the rectangular ring shape which has a small current flowing between the first semiconductor region and second semiconductor region, it is possible to connect the first conductive layer and second conductive layer while minimizing the effect on the current flowing between the first semiconductor region and second semiconductor region.

Also, even when the width needed to connect the first conductive layer and the second conductive layer is wider than the width of the first conductive layer, it is possible to keep the increase in the area of the first conductive layer to a minimum. Therefore, it is possible to suppress the decrease in level of integration.

The present invention is such that the film thickness of the insulation film that is continuous with the gate insulation film and that is under the connecting area of the first conductive layer and second conductive layer is thicker than the film thickness of the gate insulation film.

Therefore, it is possible to suppress the effect on the layer under the gate insulation film due to the connection of the first conductive layer and the second conductive layer.

The present invention is such that the width, which is the width in the channel length direction of the first conductive layer, for the area that corresponds to the connection area with the second conductive layer, is wider than the width of areas other than areas that correspond to the concerned connection area.

Therefore, even with a semiconductor component for which the channel length is relatively small, it is possible to secure a connection area for the first conductive layer and second conductive layer without substantially changing the channel length.

The present invention is such that the semiconductor components are high withstand voltage semiconductor components, and that the concerned semiconductor device also comprises low withstand voltage semiconductor components in addition to the concerned high withstand voltage semiconductor components.

Therefore, it is possible to form insulation film for separating components that are high withstand voltage semiconductor components at the same film thickness as the insulation film for separating components that are low withstand voltage semiconductor components which have a thin film thickness. Therefore, it is not necessary to increase the film thickness of insulation film for separating components for all semiconductor components or to change the film thickness of the insulation film for separating components between high withstand voltage semiconductor components and low withstand voltage semiconductor components.

Specifically, even for a semiconductor device which mixes high withstand voltage semiconductor components and low withstand voltage semiconductor components such as $E^2PROM$ or various drivers, for example, it is possible to separate components easily without sacrificing items such as level of integration, withstand voltage, and manufacturing cost.

The present invention is such that wiring is substantially performed using a first wiring layer only in the component forming region separated by an insulation film for separating components, wiring is performed using a second wiring layer on the interlayer insulation film formed on the insulation film for separating components and the first wiring layer, and that substantially the first wiring layer and second wiring layer are connected only within the component forming region.

Therefore, wiring using a first wiring layer is substantially performed only within the component forming region, so there is little possibility of the occurrence of inversion of the surface of the base semiconductor layer under the insulation film for separating components due to the voltage of the first wiring layer.

Also, even when a second wiring layer is formed on the insulation film for separating components, there is an interlayer insulation film between the second wiring layer and the insulation film for separating components, so there is little possibility of the occurrence of inversion of the surface of the base semiconductor layer that is beneath the insulation film for separating components due to the voltage of the second wiring layer.

Also, the first wiring layer and the second wiring layer are substantially connected only within the component forming region, so there is little possibility of the inversion of the surface of the base semiconductor layer that is beneath the insulation film for separating components due to the voltage of the concerned connection area.

Therefore, it is possible to perform the desired wiring without regard to being on the inside or outside of the component forming region, and it is possible to separate components easily without sacrificing items such as level of integration, withstand voltage, and manufacturing cost.

In the above description, we explained the embodiments that are preferable for the present invention, but the terms used are not used to limit the invention, but are rather used for descriptive purposes, and it is possible to make modifications within the scope of the attached claims without straying from the scope or spirit of the present invention.

What is claimed is:

1. A semiconductor device, comprising:
   a base semiconductor layer;
   an insulation film for separating components formed on the base semiconductor layer; and
   a semiconductor component which is formed on the base semiconductor layer in a component forming region separated by the insulation film for separating components, the semiconductor component having a first conductive layer, said semiconductor component including:
   an interlayer insulation film placed on the insulation film for separating components and the first conductive layer; and a second conductive layer placed on the interlayer insulation film;

wherein the first conductive layer is formed only within the component forming region; and wherein the first conductive layer and the second conductive layer are connected only within the component forming region;

a first semiconductor region of a first conductive type;

a second semiconductor region of a first conductive type, wherein the second semiconductor region is formed separate from the first semiconductor region by a specified distance;

a channel forming region of a second conductive type formed between the first semiconductor region and the second semiconductor region; and a gate insulation film formed on the channel forming region;

wherein the first conductive layer is formed on the gate insulation film, wherein the channel forming region, the gate insulation film, and the first conductive layer have a flat shape in a shape of a first ring that surrounds the first semiconductor region; wherein the first conductive layer and the second conductive layer are connected on the first ring shape of the first conductive layer and not extended out of the first ring shape; and wherein the second semiconductor region has a flat shape in a shape of a second ring that surrounds the channel forming region.

2. The semiconductor device according to claim 1, wherein a film thickness of an insulation film under a connecting area of the first conductive layer and the second conductive layer, the insulation film being continuous with the gate insulation film, is thicker than a film thickness of the gate insulation film in areas not under the connecting area of the first conductive layer and the second conductive layer.

3. The semiconductor device according to claim 1, wherein a width of an area that corresponds to the portion connecting with the second conductive layer, the width being in the channel length direction of the first conductive layer, is wider than the width of areas other than the area corresponding to the connecting area.

4. The semiconductor device according to claim 1, wherein the semiconductor component is a high withstand voltage semiconductor component; the semiconductor device comprising a low withstand voltage semiconductor component in addition to the high withstand voltage semiconductor component.

5. The semiconductor device according to claim 1, wherein the flat shape of the channel forming region, the gate insulation film, and the first conductive layer is in a rectangular first ring shape that surrounds the first semiconductor region; the first conductive layer and the second conductive layer is connected at a corner of the rectangular first ring shaped first conductive layer.

6. The semiconductor device according to claim 5, wherein a film thickness of an insulation film under a connecting area of the first conductive layer and the second conductive layer, the insulation film being continuous with the gate insulation film, is thicker than a film thickness of the gate insulation film in areas not under the connecting area of the first conductive layer and the second conductive layer.

7. A The semiconductor device according to claim 5, wherein a width of an area that corresponds to the portion connecting with the second conductive layer, the width being in the channel length direction of the first conductive layer, is wider than the width of areas other than area corresponding to the connecting area.

8. The semiconductor device according to claim 5, wherein the semiconductor component is a high withstand voltage semiconductor component; the semiconductor device comprising a low withstand voltage semiconductor component in addition to the high withstand voltage semiconductor component.

* * * * *